July 25, 1961 F. L. DONOHUE ET AL 2,994,057

ARROWHEAD LEAD FOR WIRING BOARD

Filed Aug. 14, 1957

INVENTORS
FRANK L. DONOHUE
JAMES R. TEEPLE
BY
Connolly and Hutz
THEIR ATTORNEYS

United States Patent Office 2,994,057

Patented July 25, 1961

2,994,057

ARROWHEAD LEAD FOR WIRING BOARD

Frank L. Donohue and James R. Teeple, Nashua, N.H., assignors to Sprague Electric Company, North Adams, Mass., a corporation of Massachusetts Filed Aug. 14, 1957, Ser. No. 678,095

4 Claims. (Cl. 339—17)

This invention relates to leads for disc capacitors and more particularly to leads for mounting disc capacitors in position in printed electric circuits.

In the printing of electric circuits it is necessary to attach components into the printed circuit. In attaching these components into the circuits, apertures are formed in the boards on which the circuit is printed. The components must be properly positioned in and on the printed board to provide the proper assembly of the circuit. The components must extend sufficiently into the board perforations and yet not extend too far. The leads must give the mounting of the capacitor on the printed board stability and at the same time not extend so far as to the point of bringing the capacitor cover coating into contact with the printed circuit.

In thus mounting components in printed circuits it is necessary to avoid the creation of additional problems. For example, one possible method of positioning the component leads into perforations in the printed board would be to provide the leads with an undulating shape. This means for momentary positioning the components at a certain spacing with relation to the printed board in turn has a shortcoming of introducing an inductive effect between the leads. Further, the means of positioning the component on the boards should preferably have a further function than simply positioning the components spaced from the printed board.

It is an object of this invention to provide a means and method for mounting and supporting components in a perforated board carrying a printed circuit.

It is a further object of this invention to provide leads which are formed to properly mount and support an electrical component in a printed circuit board.

It is still another object of this invention to provide means on the leads of an electrical component which will position and stabilize the electrical component in apertures in a printed circuit board.

These and other objects of this invention will become more apparent from consideration of the following description taken together with the accompanying drawings in which.

The leads of electrical components of this invention position and stabilize the component in apertures formed in printed circuit boards. This means is a swedged fin and rib combination in each of the leads. A heavy central rib is provided having two radially tapered fins extending normal to each side of the respective rib. The lead is formed so that each lead crimps normal to the longitudinal dimension of the component to permit locking of the component and allow the lead to work in the board perforation. Lead crimps in the longitudinal dimension of the component may create inductive effects between adjacent leads. The fin has a wedge shape which broadens along the axial dimension of the lead and tapers with a second short wedge.

It is a still further object of this invention to provide a disc capacitor carrying leads formed to attach the capacitor to reception on a conductive connection in a printed circuit board.

Figure 1:
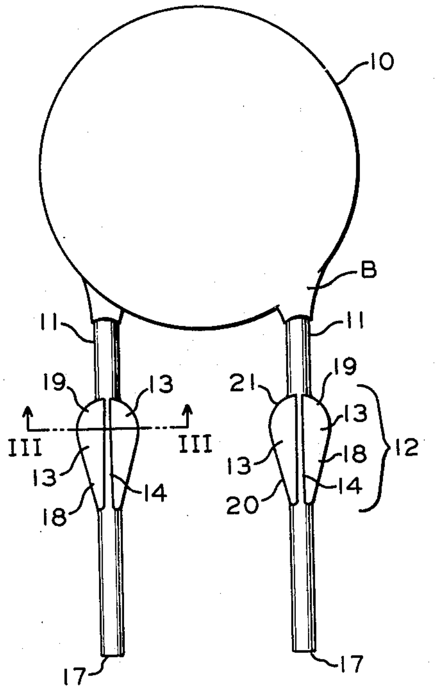
FIG. 1 is a front elevational view of a capacitor with leads embodying this invention.
Figure 2:
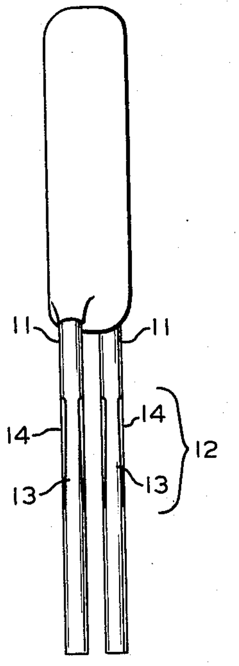
FIG. 2 is a side elevational view of the capacitor of FIG. 1.

FIG. 1 shows a component incorporating this invention, such as a disc capacitor 10 having a pair of leads 11 extending downwardly therefrom. As shown in FIG. 2 the leads 11 are offset in the lateral dimension of the disc. As seen in FIGS. 1 and 2, each of the leads is formed with a swedged portion 12. The swedged portions 12 have each a pair of fins 13 extending laterally at each side of the swedged portion 12, as seen in FIG. 1 and a central rib 14 normally extends to the plane of the fins 13 and also lateral of the respective lead 11.

Figure 3:
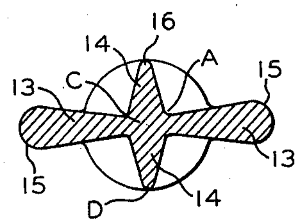
FIG. 3 is a radial section of one of the leads of the capacitor taken on line III—III of FIG. 1.

As shown in the radial section of FIG. 3 taken on line III—III of FIG. 1 the fins 13 are normal in their orientation to the central rib 14. This is representative of both of the leads 11. The fins 13 are formed with a reverse taper proceeding outward radially from the center C, so that the width of each of the fins 13 decreases in dimension from an outer bulbous tip 15 to the point A where the fin 13 joins the rib 14. The rib 14 on the other hand tapers radially to a sharp tip 16 so that it has a radial V-shape extending from a relatively broad base at A to the sharp tip 16.

The swedged portions 12 are formed in the respective leads 11 at a section spaced from end 17 of the respective leads 11. The leads 11 join the capacitor 10 at respective junctures B shown in FIG. 1. The swedged portion 12 is spaced from its respective juncture B. The ribs 14 of the respective leads 11 are of the same over-all radial dimension as the remainder of the lead 11. The fins 13 on the other hand are flared away from the center of the leads 11 to a wider radial dimension than the leads 11. In the form of the invention shown and described in this embodiment, each of the fins 13 is made up of a pair of wedges. A major wedge 18 tapers outward from the radius of the lead 11 at its lower or remote end to a greatest radial dimension at its upper or inner end, as shown in FIG. 1. A minor wedge 19 tapers from its widest radial dimension to the radial dimension of the lead 11. The wedges 18 and 19 are defined by respective outer edges 20 and 21 which tapers the fin 13 inward in two directions from its widest radial dimension. The wedge edge 20 forms a small angle with the axis of the lead 11 than the wedge edge 21 and as a result the slope formed between wedge edge 20 is similar to that of the wedge edge 21.

The swedged portion 12 is formed in its respective lead by a suitable swedging action by a die which forms the metal of the lead 11 into the desired cross-sectional shape. The die swedges the metal of the lead 11. In most applications of this invention the lead 11 is composed of copper with a tin coat. In forming the rib and fin cross-section as illustrated the copper is worked into the desired shape and flows under the pressure of the action of the die. The tin coat covering the swedged portion 12 formed by the die is deformed by the swedging action. The copper is flowed by the swedging action of the cross-sectional shape described above and shown in the drawings according to this invention and as a result forms the bulbous tip 15 on each of the fins 13. This bulbous tip 15 has a peripheral curvature of a relatively large radius so that sharp angles over the flowed copper are avoided. This makes it possible for the tin coat to be malleable under the pressure of the swedging and to remain intact covering the surface of the fin 13 without any breaks or cracks. The rib 14 on the other hand represents the structure of the lead 11 undeformed. Consequently, the tip 16 of each of the ribs 14 forms a relatively sharp angular point over which the tin coat lies without breaking or otherwise being parted.

It is thus seen that the cross-sectional shape of this invention and the means of forming the lead into this cross-sectional shape is adapted to favor the preservation of the continuity of the tin coat. As indicated above, the different material of the fins 13 is provided with a curvature of a large radius while the rib is curved of relatively undeformed metal and a smaller radius of curvature is provided at its outer surface.

As a specific instance a No. 20 A.W.G. wire of 32 mils diameter is formed into the shape shown and described herein having fins 13 which are 8 mils thick at A and 10 mils thick in cross-section across the tip 15. The rib 14 formed from the No. 20 A.W.G. wire tapers from a 10 mil thickness at A near the center of the wire down to 6 mils at point D as shown in FIG. 3. At its widest lateral dimension the arrowhead shape is 60 mils in dimension in the No. 20 A.W.G. wire. Correspondingly, in a No. 19 A.W.G. (36 mils) wire the lateral width of the arrowhead is about 65 mils. In both of these formed arrowheads the width of the rib 14 remains the same as the diameter of the wire.

Among other advantages, this invention provides a means for mounting electrical components in printed circuit boards with mechanical stability and a provision of sufficient electrical contact area. The leads of this invention properly space the capacitor or other electrical component with respect to the printed board and the circuitry of the board. In addition, this invention allows for a rapid and automatic assembly of components on the printed board as the capacitor or other component is automatically, properly spaced and mounted and prepared for subsequent assembly steps. In the subsequent assembly steps the component is soldered into the circuitry or otherwise electrically connected after having been properly positioned by the structure of this invention.

Further, this invention provides for a swedging or forming of the conventional component leads, without destroying the characteristics or properties of these leads. For example, the coating on the leads is not destroyed by the die forming action. Further, this method is easily adaptable to standard procedures. A swedging tool may be provided with clamping jaws for holding the lead between the swedged portion and the end of the lead. A cut-off jaw cuts the leads. It will be understood that the cut-off jaw can be adjusted to cut the leads to the length dictated by the various applications into which the component is to be assembled.

A further advantage is found in the fact that while the lead is formed its strength is not diminished. The central rib 14 remains in the lead, preserving the full diameter of the lead and providing maximum strength. Also, by this invention forming of the lead will not elongate the lead. As pointed out above, clamping jaws provided on the swedging tool hold the overall length without affecting the procedure of forming the lateral fins.

The leads may be swedged to form the structure of this invention while taped to suitable carriers. This invention is adapted to high volume automatic operations.

Other advantages of this invention have been indicated above in the description.

The above-described specific embodiment of our invention has been set forth for the purpose of illustration. It will be apparent to those skilled in the art that various modifications may be made in the formed lead structure without departing from the principles of this invention as pointed out and disclosed herin. For that reason, it is not intended that the invention should be limited other than by the scope of the appended claims.

We claim:

1. A modular electrical circuit assembly comprising a board having perforations therein, a circuit pattern printed on said board, an electrical component mounted on said board and connected in conductive relation with said circuit pattern, a lead-wire extending from said component, a first portion said lead-wire having a substantially uniform diameter forming a peripheral surface a second portion intermediate the ends thereof, said second portion formed with means for positioning said component on said board by engagement in said perforations, said means including angular diametric fins extending beyond said peripheral surface of said first portion and reinforcing ribs extending axially of said lead, said fins being tapered in a direction away from said component.

2. The combination with an electrical component for mounting in a printed circuit, a lead-wire of substantially circular cross-section with a uniform diameter forming a peripheral surface except for portion intermediate the ends thereof, said portion formed with means for engaging a printed circuit, said means including angular diametrically extending members in said formed portion, said members including tapered fins extending diametrically beyond said cross-section, and a central rib extending the length of said members substantially normal to said fins.

3. The combination claimed in claim 2, wherein an edge of each of said fins tapered in the radial dimension at an angle to the axis of said lead from a wide radial dimension to a narrower radial dimension more removed from said component, said fins also tapering in thickness toward the radial plane of said lead inversely of the distance from the lead center.

4. In the combination as claimed in claim 2, said central rib in said formed portion having the overall dimension of the original diameter of the lead.

References Cited in the file of this patent

UNITED STATES PATENTS

| | | |
|---|---|---|
| 8,635 | Farley | Mar. 25, 1879 |
| 1,578,667 | Kelsay | Mar. 30, 1926 |
| 2,771,295 | Andres | Nov. 20, 1956 |

OTHER REFERENCES

Federal: "Electronic Equipment," August 1955, page 5.